United States Patent
Auernheimer et al.

(10) Patent No.: US 7,495,336 B2
(45) Date of Patent: Feb. 24, 2009

(54) ARRAY CAPACITORS FOR BROADBAND DECOUPLING APPLICATIONS

(75) Inventors: Joel A. Auernheimer, Phoenix, AZ (US); Nicholas Holmberg, Gilbert, AZ (US); Kaladhar Radhakrishnan, Chandler, AZ (US); Dustin P. Wood, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 11/322,384

(22) Filed: Dec. 30, 2005

(65) Prior Publication Data

US 2007/0152301 A1 Jul. 5, 2007

(51) Int. Cl.
*H01L 29/00* (2006.01)
(52) U.S. Cl. .............. 257/758; 257/E23.057; 257/532; 257/924; 257/528; 257/728; 257/724; 257/725
(58) Field of Classification Search .......... 257/758, 257/E23.057, 532, 924, 528, 728, 724, 725; 361/309, 303, 311
See application file for complete search history.

(56) References Cited

U.S. PATENT DOCUMENTS

| | | | | |
|---|---|---|---|---|
| 5,909,154 | A * | 6/1999 | Brown et al. | 333/100 |
| 6,876,877 | B2* | 4/2005 | Eden | 505/210 |
| 6,888,715 | B2* | 5/2005 | Stevenson et al. | 361/302 |
| 7,075,776 | B1* | 7/2006 | Devoe et al. | 361/309 |
| 7,263,764 | B2* | 9/2007 | Heistand et al. | 29/610.1 |
| 2003/0072125 | A1* | 4/2003 | Galvagni et al. | 361/306.3 |
| 2003/0213605 | A1* | 11/2003 | Brendel et al. | 174/35 R |
| 2005/0141206 | A1 | 6/2005 | Radhakrishnan et al. | |
| 2006/0067852 | A1 | 3/2006 | Suh et al. | |
| 2006/0087030 | A1 | 4/2006 | Auernheimer et al. | |
| 2006/0143886 | A1 | 7/2006 | Srinivasan et al. | |

OTHER PUBLICATIONS

Suh, D., "Intermetallic Solder With Low Melting Point", U.S. Patent Appl. No. 11/229,184, filed Sep. 15, 2005.

* cited by examiner

*Primary Examiner*—Alexander O Williams
(74) *Attorney, Agent, or Firm*—John N. Greaves (57) ABSTRACT

An integrated broadband array capacitor includes at least two regions with varying capacitance and response times. The broadband array capacitor is disposable on a socket or is integral with a socket. A method of operating the broadband array capacitor includes responding to load transients from each of the at least two regions. A computing system is also disclosed that includes the broadband array capacitor.

24 Claims, 7 Drawing Sheets

ARRAY CAPACITORS FOR BROADBAND DECOUPLING APPLICATIONS

TECHNICAL FIELD

Disclosed embodiments relate to a plate capacitor assembly.

BACKGROUND INFORMATION

A microelectronic die often requires capacitative power sources to respond to transient loads generated during operation. Capacitors are provided to answer the transient load requirements of the die. Operation of capacitors, such as parallel-plate capacitors, can generate inductive events that can affect signal flow to and from the die.

Power delivery is a significant concern in the design and operation of the device. Where the microelectronic device is a processor or an application-specific integrated circuit (ASIC), an adequate current delivery, a steady voltage, and an acceptable processor transient response are desirable characteristics of the overall microelectronic device package. One of the methods for responding to a processor transient is to place a high-performance capacitor as close to the processor as possible to shorten the transient response time. A high-performance capacitor is in competition for space in the immediate vicinity of the processor.

BRIEF DESCRIPTION OF THE DRAWINGS

In order to understand the manner in which embodiments are obtained, a more particular description of various embodiments briefly described above will be rendered by reference to the appended drawings. Understanding that these drawings depict only typical embodiments that are not necessarily drawn to scale and are not therefore to be considered to be limiting of its scope, some embodiments will be described and explained with additional specificity and detail through the use of the accompanying drawings in which.

DETAILED DESCRIPTION

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1:
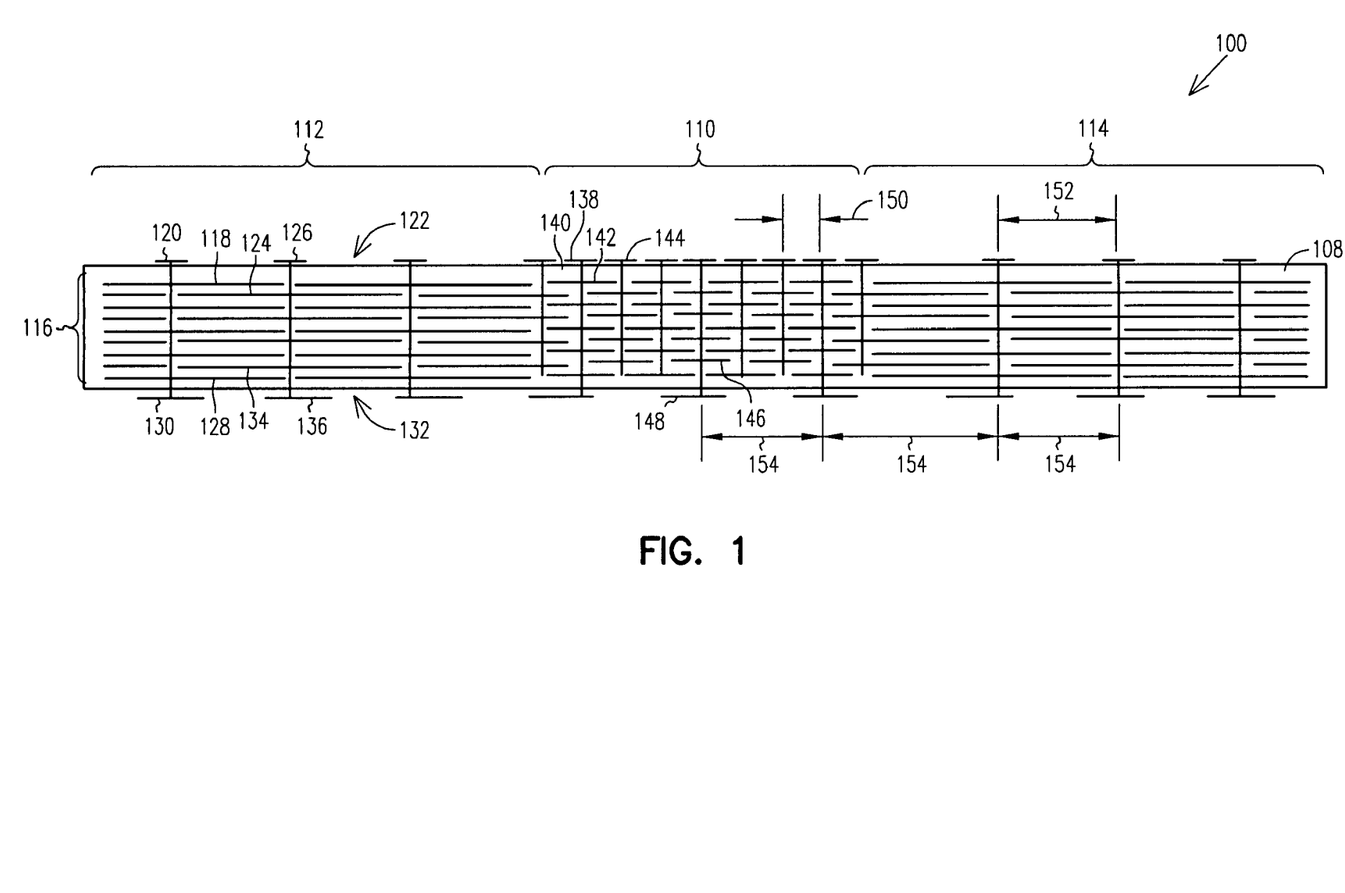
FIG. 1 is a cross-section elevation of a broadband array capacitor assembly according to an embodiment.

FIG. 1 is a cross-section elevation of a broadband array (BA) capacitor assembly 100 according to an embodiment. In an embodiment, the BA capacitor assembly 100 is packaged in a packaging material 108, which can include a sintered ceramic such as a barium-strontium-titanate (BST) material. In an embodiment, the BA capacitor assembly 100 is packaged in a packaging material 108, which can include a thermoplastic laminate. In an embodiment, the thermoplastic laminate can include inorganic dielectric material dispersions to facilitate a coefficient of thermal expansion (CTE) approximation with the metallic materials of plates and terminals that are located in the BA capacitor assembly 100. The BA capacitor assembly 100 includes a first region 110 and a first capacitance. When the BA capacitor assembly 100 is integrated into an active circuit, it has and a first response time capability. The BA capacitor assembly 100 also includes a second region 112 that is laterally displaced from the first region 110, and which includes a second capacitance. When the second region 112 of the BA capacitor assembly 100 is integrated into an active circuit, it has and a second response time capability that is less than the first response time capability. In an embodiment, the BA capacitor assembly 100 also includes a symmetry second region 114 that is symmetrical to the second region 112, when mirrored across the first region 110, which includes substantially the same second capacitance as that of the second region 112. Similarly, when the symmetry second region 114 is integrated into an active circuit, it exhibits substantially the same second response time capability as that of the second region 112. Accordingly, the symmetry second region 114 can be a mirror-image structure of the second region 112.

The first region 110 and the second region 112 share a plurality of parallel plates 116, some of which intersect both regions 110 and 112. In an embodiment, the plates 116 located in both regions 110 and 112 are integrally packaged together. In an embodiment, a top plate 118 is coupled to a first top terminal 120 on a die side 122 of the BA capacitor assembly 100. The first top terminal 120 is located in the second region 112. A first intermediate plate 124 is coupled to a second top terminal 126, which is also on the die side 122 of the BA capacitor assembly 100. Similarly in an embodiment, a bottom plate 128 is coupled to a first bottom terminal 130 on a land side 132 of the BA capacitor assembly 100. A second intermediate plate 134 is coupled to a second bottom terminal 136, which is also on the land side 132 of the BA capacitor assembly 100.

In the first region 110, a top plate 138 is coupled to a first top terminal 140 on a die side 122 of the BA capacitor assembly 100. A first intermediate plate 142 is coupled to a second top terminal 144, which is also on the die side 122 of the BA capacitor assembly 100. Similarly in an embodiment, a second intermediate plate 146 is coupled to a second bottom terminal 148 on the land side 132 of the BA capacitor assembly 100.

The plurality of parallel plates 116 is depicted with a number of about nine plates for illustrative simplicity. In an embodiment, the number of parallel plates 116 is about nine. In an embodiment, the number of parallel plates 116 is about 100. In an embodiment, the number of parallel plates 116 is in a range from about 100 to about 1,000. In an embodiment, the number of parallel plates 116 is in a range from about 1,000 to about 5,000. In an embodiment, the number of parallel plates 116 is in a range from about 5,000 to about 10,000.

Plate pitch is depicted in the first region 110 and the symmetry second region 114. On the die side 122, a first region pitch 150 is depicted in the first region 110, and a symmetry second region pitch 152 is depicted in the symmetry second region 114. In an embodiment the first region pitch 150 is denser than the symmetry second region pitch 152. On the land side 132, the pitch 154 between terminals in the first region 110 and the symmetry second region 114 is the same. Accordingly in this embodiment, the land-side terminal pitch 154 is substantially uniform, whether it is in the first region 110 on the land side 132 or it is in the symmetry second region 114 on the land side 132.

In an embodiment, operation of the BA capacitor assembly 100 includes responding to a first load transient from a die, by discharging the capacitor made of the parallel plates 116 that are located in the first region 110. In an embodiment, operation of the BA capacitor assembly 100 includes responding to a first subsequent load transient from the die, by discharging the parallel plates 116 that are located in the first region 110. In an embodiment, operation of the BA capacitor assembly 100 includes responding to a second subsequent load transient from the die, by discharging the parallel plates 116 that are located in the second region 112.

In an embodiment, operation of the BA capacitor assembly 100 includes first responding to a first load transient from a die, by discharging the parallel plates 116 that are located in the first region 110, followed by discharging the parallel plates 116 that are located in at least one of the second region 112 or the symmetry second region 114. In an embodiment, the first region 110 first discharges, and the second region 112 and symmetry second region 114 subsequently discharge, substantially simultaneously.

Figure 2:
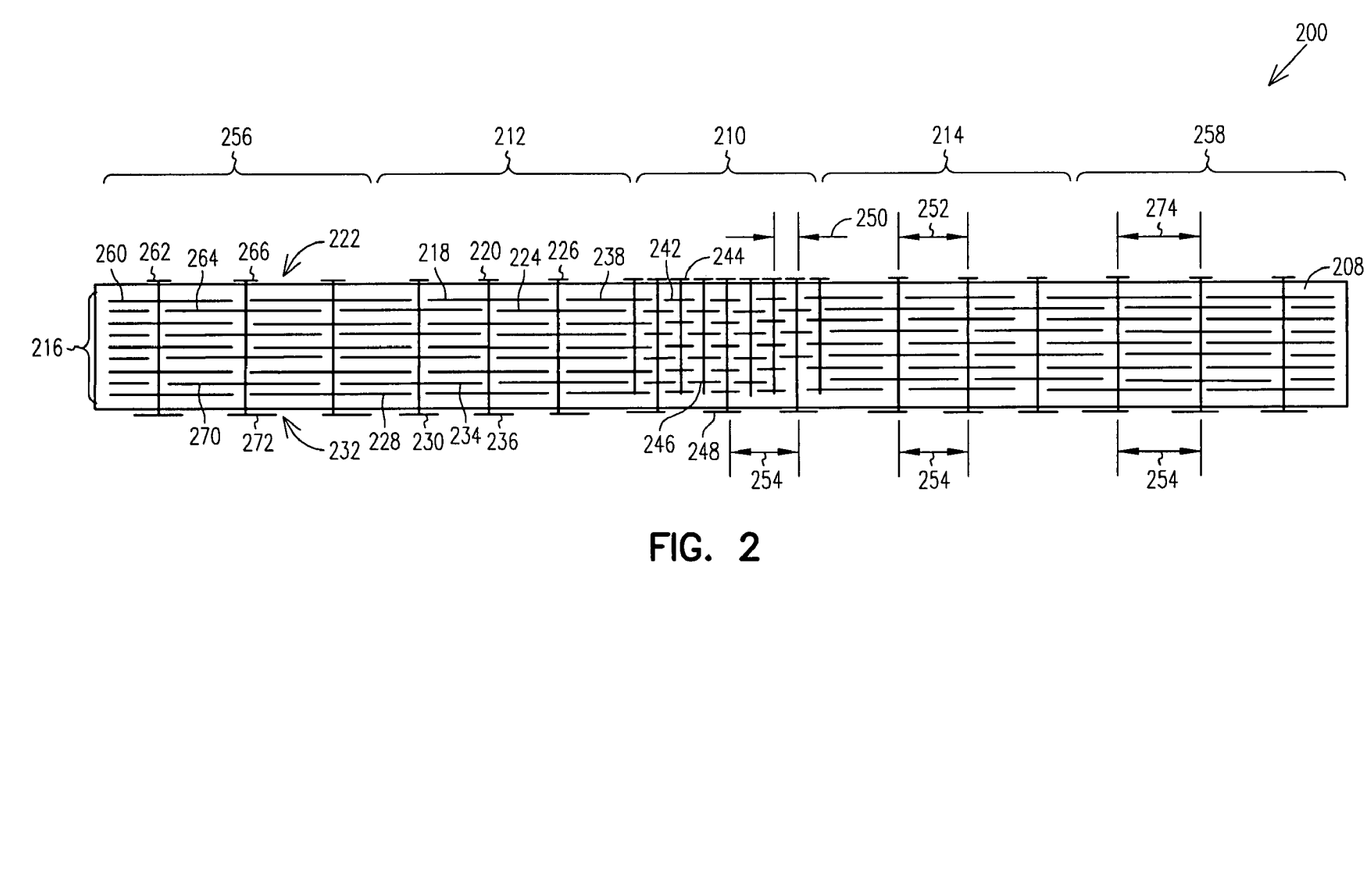
FIG. 2 is a cross-section elevation of a broadband array capacitor assembly according to an embodiment.

FIG. 2 is a cross-section elevation of a broadband array capacitor assembly 200 according to an embodiment. In an embodiment, the BA capacitor assembly 200 is packaged in a packaging material 208, which can include a sintered ceramic such as BST. In an embodiment, the BA capacitor assembly 200 is packaged in a packaging material 208, which can include a thermoplastic laminate. In an. embodiment, the thermoplastic laminate can include inorganic dielectric material dispersions to facilitate a CTE approximation with the metallic materials of the plates and terminals.

The BA capacitor assembly 200 includes a first region 210, which includes a first capacitance. When the first region 210 is integrated into an active circuit, it exhibits a first response time capability. The BA capacitor assembly 200 also includes a second region 212, which includes a second capacitance. When the second region 212 is integrated into an active circuit, it exhibits and a second response time capability. In an embodiment, the BA capacitor assembly 200 also includes a symmetry second region 214, which includes substantially the same second capacitance. When the symmetry second region 214 is integrated into an active circuit, it exhibits and substantially the same second response time capability as that of the second region 212. Accordingly, the symmetry second region 214 can be a mirror-image structure of the second region 212. The BA capacitor assembly 200 also includes a third region 256, which includes a third capacitance. When the third region 256 is integrated into an active circuit, it exhibits and a third response time capability. In an embodiment, the BA capacitor assembly 200 also includes a symmetry third region 258, which includes substantially the same third capacitance and substantially the same third response time capability as that of the third region 256.

The first region 210, the second regions 212 and 214, and the third regions 256 and 258 share a plurality of parallel plates 216, some of which intersect all regions. In an embodiment, a top plate 218 is coupled to a first top terminal 220 on a die side 222 of the BA capacitor assembly 200. The first top terminal 220 is located in the second region 212. A first intermediate plate 224 is coupled to a second top terminal 226, which is also on the die side 222 of the BA capacitor assembly 200. Similarly in an embodiment, a bottom plate 228 is coupled to a first bottom terminal 230 on a land side 232 of the BA capacitor assembly 200. A second intermediate plate 234 is coupled to a second bottom terminal 236, which is also on the land side 232 of the BA capacitor assembly 200.

In the first region 210, a top plate 238 is coupled to a first top terminal 240 on the die side 222 of the BA capacitor assembly 200. A first intermediate plate 242 is coupled to a second top terminal 244, which is also on the die side 222 of the BA capacitor assembly 200. Similarly in an embodiment, a second intermediate plate 246 is coupled to a second bottom terminal 248 on the land side 232 of the BA capacitor assembly 200.

In the third region 256, a top plate 260 is coupled to a first top terminal 262 on the die side 222 of the BA capacitor assembly 200. A first intermediate plate 264 is coupled to a second top terminal 266, which is also on the die side 222 of the BA capacitor assembly 200. Similarly in an embodiment, a second intermediate plate 270 is coupled to a second bottom terminal 272 on the land side 232 of the BA capacitor assembly 200.

Plate pitch is depicted in the first region 210, the symmetry second region 214, and the symmetry third region 258. On the die side 222, a first region pitch 250 is depicted in the first region 210, a symmetry second region pitch 252 is depicted in the symmetry second region 214, and a symmetry third region pitch 274 is depicted in the symmetry third region 258. In an embodiment, the first region pitch 250 is denser than the symmetry second region pitch 252, which in turn is denser than the symmetry third region pitch 274. On the land side 232, the pitch 254 between terminals in the first region 210, the symmetry second region 214, and the symmetry third region 258 are substantially the same. Accordingly, in this embodiment, the land-side terminal pitch 254 is substantially uniform, whether it is in the first region 210 on the land side 232, in the symmetry second region 214 on the land side 232, or in the symmetry third region 258 on the land side 232.

In an embodiment, operation of the BA capacitor assembly 200 includes responding to a first load transient from a die, by discharging the capacitor made of the parallel plates 216 that are located in the first region 210. In an embodiment, operation of the BA capacitor assembly 200 includes responding to a first subsequent load transient from the die, by discharging the parallel plates 216 that are located in the first region 210. In an embodiment, operation of the BA capacitor assembly 200 includes responding to a second subsequent load transient from the die, by discharging the parallel plates 216 that are located in the second region 212. In an embodiment, operation of the BA capacitor assembly 200 includes responding to a third subsequent load transient from the die, by discharging the parallel plates 216 that are located in the third region 256. In an embodiment, any region can first discharge, followed by any region (including the region that first discharged) that can subsequently discharge.

In an embodiment, operation of the BA capacitor assembly 200 includes first responding to a first load transient from a die, by discharging the parallel plates 216 that are located in the first region 210, followed by discharging the parallel plates 216 that are located in at least one of the second region 212 or the symmetry second region 214. In an embodiment, operation of the BA capacitor assembly 200 includes first responding to a first load transient from a die, by discharging the parallel plates 216 that are located in the first region 210, followed by discharging the parallel plates 216 that are located in at least one of the third region 256 or the symmetry third region 258. In an embodiment, any permutation of discharge can be used to discharge the parallel plates 216 in any or all of the first region 210, the second region 212, the symmetry second region 214, the third regions 256, and the symmetry third region 258.

Figure 3:
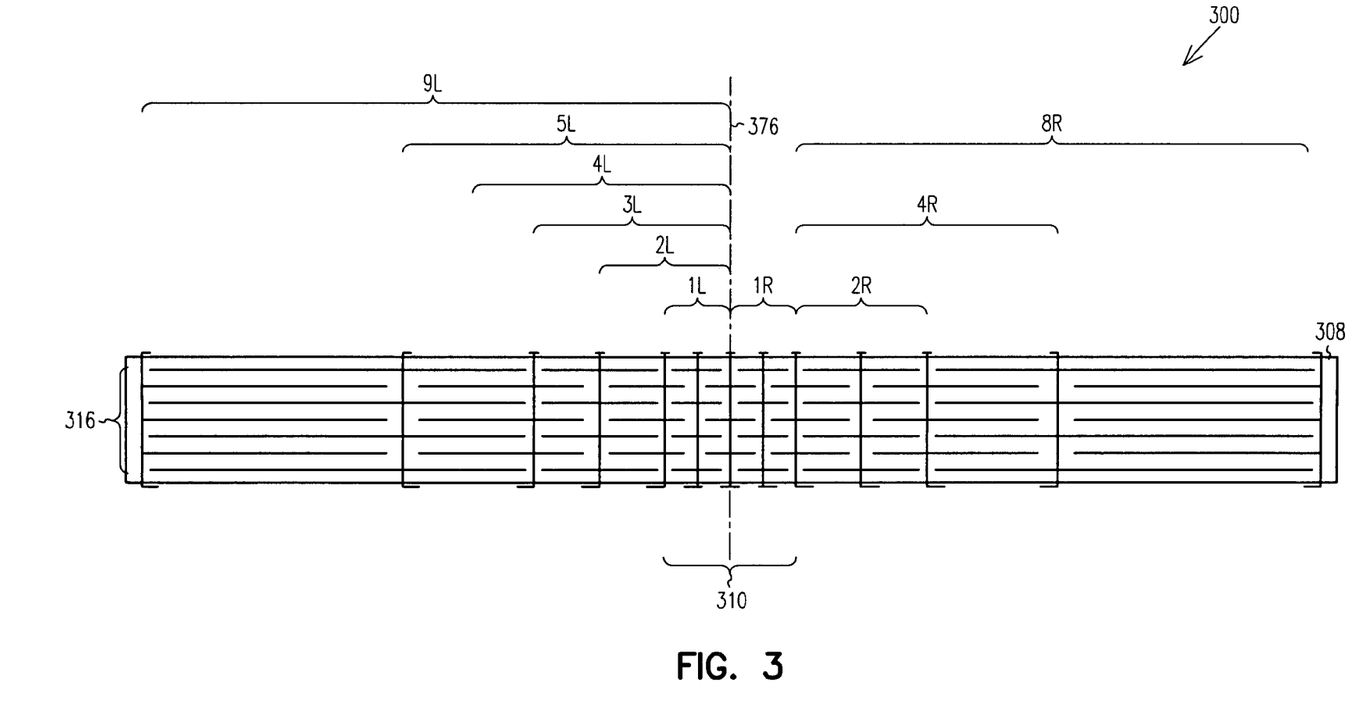
FIG. 3 is a cross-section elevation of a broadband array capacitor assembly according to an embodiment.

FIG. 3 is a cross-section elevation of a broadband array capacitor assembly 300 according to an embodiment. In an embodiment, the BA capacitor assembly 300 is packaged in a packaging material 308, which can include a sintered ceramic. In an embodiment, the BA capacitor assembly 300 is packaged in a packaging material 308, which can include a thermoplastic laminate. In an embodiment, the thermoplastic laminate can include inorganic dielectric material dispersions to facilitate a CTE approximation with the metallic materials of the plates and terminals. The BA capacitor assembly 300 includes "digital plate area regions" that can be accessed by various terminals, such that a wide variety of discharge amounts can be achieved. Two plate regions, designated as 1L (for 1 left) and 1R (for 1 right) comprise a first region 310, which substantially straddles a symmetry line 376 of the BA capacitor assembly 300 in this embodiment.

Other regions and symmetry regions are discernable in the BA capacitor assembly 300. The BA capacitor assembly 300 is configured, however, to provide a digitally increasing amount of capacitance by accessing the various terminals, or all of them. Accordingly, a plate region 2L represents about twice the plate area of either of the regions 1L and 1R. Accordingly, capacitance can be quantified substantially equally by discharging from the first region 310 or from the region 2L. The difference in charge will be affected by the number of terminals that must penetrate the various plates 316. Accordingly, where more terminals are present such as in the first region 310, the discharge potential for the first region 310 is lower than the discharge potential from the region 2L, although the two regions have substantially the same lateral dimensions. Accordingly, a continuum-emulating plurality digital plate capacitor can achieve capacitance discharges that are, discounting plate area displaced by terminals, one, two (e.g. 2L), three (e.g. 3L), four (e.g. 4R or 4L), five (e.g. 5L), six (e.g. 2L and 4R), seven (e.g. 2R and 5L), eight (e.g. 8R), nine (e.g. 9L), 10 (e.g. 1R and 9L), etc. In an embodiment, the discharge time for any of the digital plate regions can vary.

In an embodiment, a specialized task required by a die can be determined empirically or by design, and a specific response algorithm can be prepared for any of the BA capacitor assemblies by accessing selected regions to meet the specialized load transients of the die.

Figure 4:
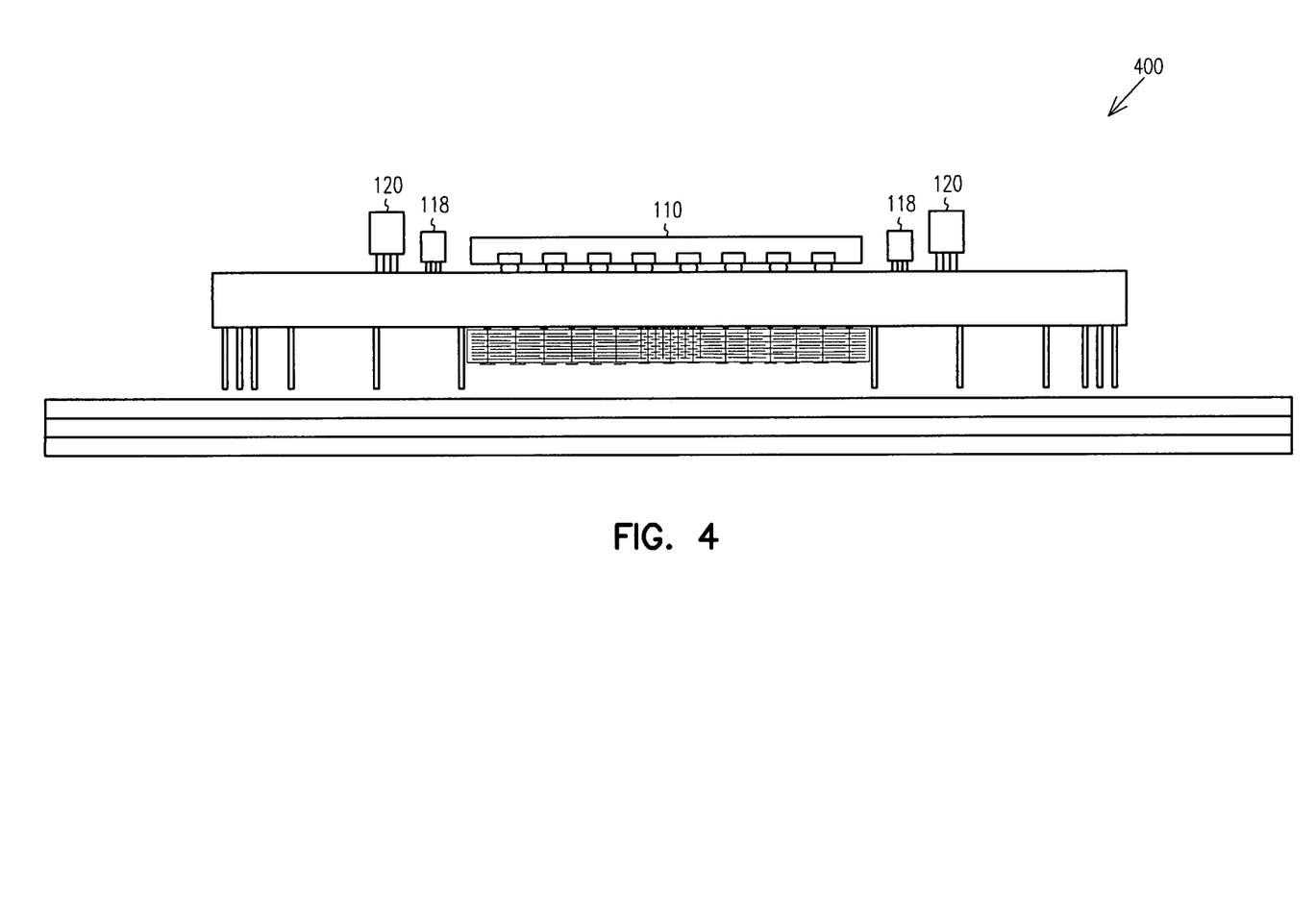
FIG. 4 is a cross-section elevation of a broadband array capacitor package coupled to a die through a socket according to an embodiment.

FIG. 4 is a cross-section elevation of a broadband array capacitor package 400 coupled to a die 478 through a socket 480 according to an embodiment. A BA capacitor structure 406 is mounted on the socket 480 opposite the die 478. The socket 480 includes a plurality of pins, one of which is designated by reference numeral 482. Both power and signal pins are present. The socket 480 is depicted as being couplable to a board 484, such as a motherboard for a computing system.

The BA capacitor structure 406 is depicted as including a first region 410, a second region 412, and a symmetry second region 414, similar to the regions depicted in the BA capacitor assembly 100 in FIG. 1. Other regions are deployable, such as those depicted in FIG. 2 or in FIG. 3, or a combination thereof.

Loop inductance in the BA array capacitor package 400 is experienced from the BA capacitor structure 406, such that a response to a load transient in the die 478 amounts to an electrical pulse substantially beneath the die 478, with the circuit passing through the socket 480 between the die 478 and the BA capacitor structure 406.

A component first capacitor 486 is depicted disposed on the socket 480 on the die side thereof. Loop inductance in the BA array capacitor package 400 is also experienced from the component first capacitor 486. The loop inductance from the component first capacitor 486 includes a convoluted loop, such that a response to a load transient in the die 478 amounts to an electrical pulse that begins laterally to the die 478, passes into the socket 480, discharges into the die 478, and returns laterally to the component first capacitor 486.

A component second capacitor 488 is depicted disposed on the socket 480 on the die side thereof. Loop inductance in the BA array capacitor package 400 is also experienced from the component second capacitor 488. The loop inductance from the component second capacitor 488 includes a convoluted loop such that a response to a load transient in the die 478 amounts to an electrical pulse that begins laterally to the die 478, that passes into the socket 480, discharges into the die 478, and returns laterally to the component second capacitor 488.

In an embodiment, the loop inductance experienced from the BA capacitor structure 406 is smaller than the loop inductance from either of the component first capacitor 486 or the component second capacitor 488. In an embodiment, the loop inductance experienced from the BA capacitor structure 406 first region 410 is smaller than the loop inductance from either of the second region 412 or the symmetry second region 414.

Figure 5:
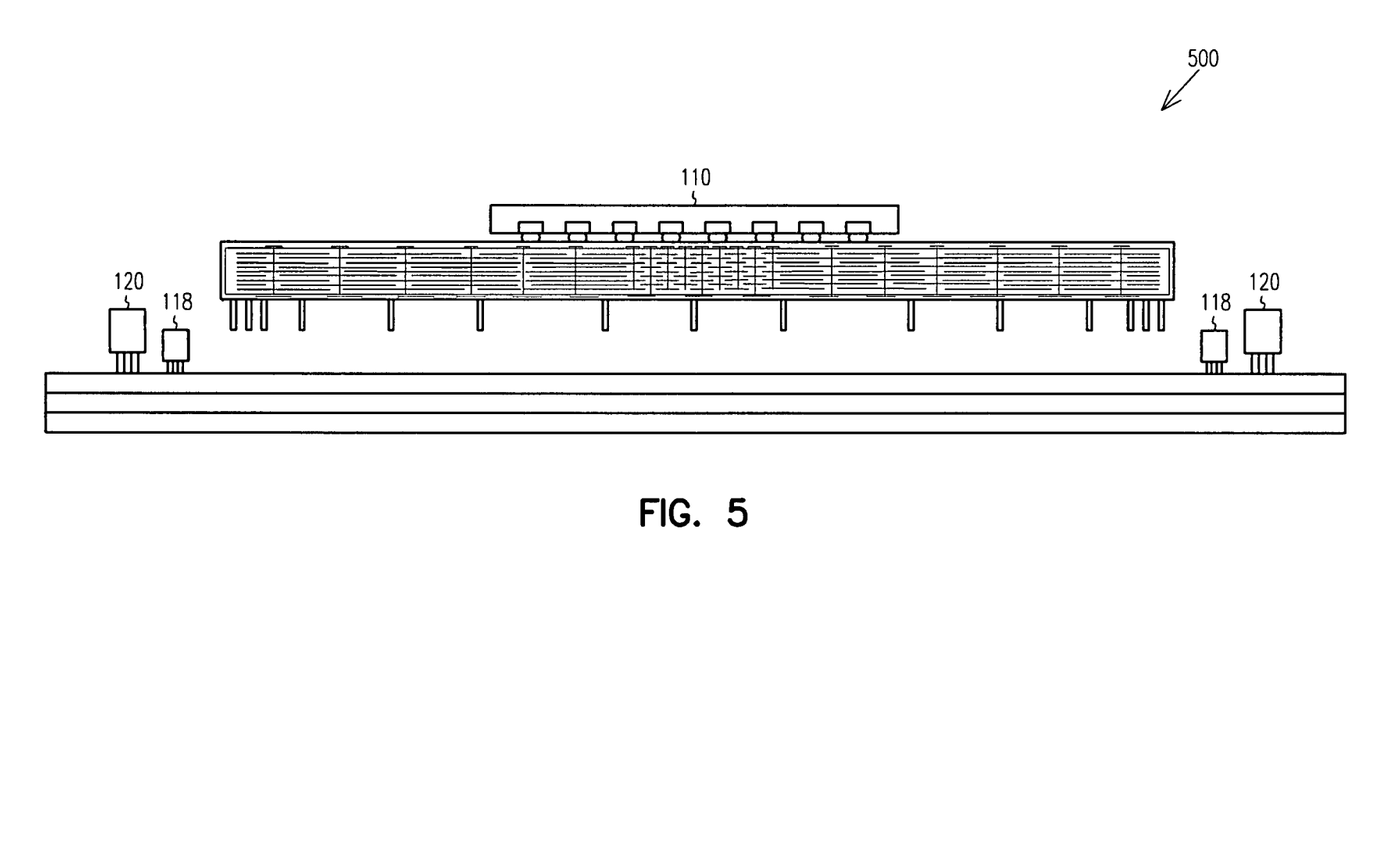
FIG. 5 is a cross-section elevation of a broadband array capacitor socket coupled to a die according to an embodiment.

FIG. 5 is a cross-section elevation of a broadband array capacitor package 500 according to an embodiment. A BA capacitor socket 504 is coupled to a die 578 according to an embodiment. A BA capacitor socket 504 also includes parallel plates 516 that act as capacitor plates. FIG. 5 demonstrates that BA capacitor is integral with the socket 504. The BA capacitor socket 504 includes a plurality of pins, one of which is designated by reference numeral 582. The BA capacitor socket 504 is depicted as being coupled to a board 584 such as a motherboard for a computing system.

The BA capacitor socket 504 is depicted as including a first region 510, a second region 512, and a symmetry second region 514 similar to the regions depicted in the BA capacitor assembly 100 in FIG. 1. Other regions are deployable such as those depicted in FIG. 2 or in FIG. 3, or a combination thereof.

Loop inductance in the BA capacitor package 500 is experienced from the BA capacitor socket 504 such that a response to a load transient in the die 578 amounts to an electrical pulse substantially beneath the die 578, with the circuit passing through the BA capacitor socket 504 from the first region 510.

In an embodiment, the loop inductance experienced from the BA capacitor socket 504 first region 510 is smaller than the loop inductance from either of the second region 512 or the symmetry second region 514.

A component first capacitor 586 is depicted disposed on the board 584. Loop inductance in the BA array capacitor package 500 is also experienced from the component first capacitor 586. The loop inductance from the component first capacitor 586 includes a convoluted loop such that a response to a load transient in the die 578 amounts to an electrical pulse that begins lateral to the die 578, that passes into the board 584, that discharges into the die 578, and that returns laterally to the component first capacitor 586.

A component second capacitor 588 is depicted disposed on the board 584. Loop inductance in the BA array capacitor package 500 is also experienced from the component second capacitor 588. The loop inductance from the component second capacitor 588 includes a convoluted loop such that a response to a load transient in the die 578 amounts to an electrical pulse that begins lateral to the die 578, that passes into the board 584, that discharges into the die 578, and that returns laterally to the component second capacitor 588.

Figure 6:
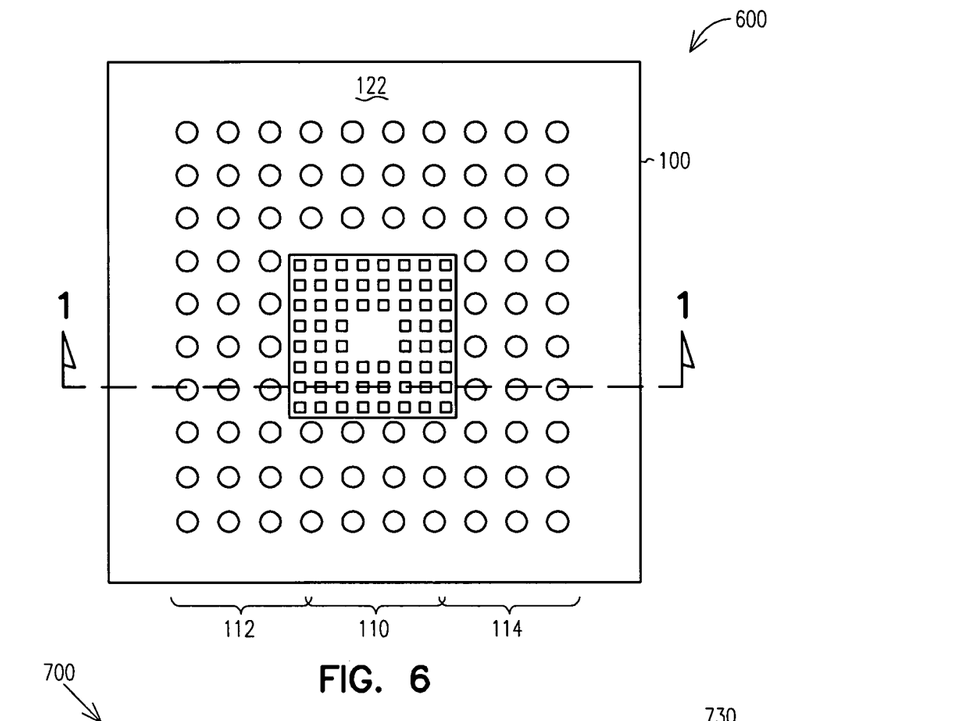
FIG. 6 is a plan detail of a broadband array capacitor assembly die side according to an embodiment.

FIG. 6 is a plan detail 600 of the broadband array capacitor assembly 100 die side 122 depicted in FIG. 1 according to an embodiment. The BA capacitor assembly 100 depicted in FIG. 1 can be seen when viewed along the section line 1-1 in FIG. 6. Accordingly, the first region 110, the second region 112, and the symmetry second region 114 in FIG. 1 can be seen by projecting the similarly labeled, respective bracketed areas onto the section line 1-1. In an embodiment, the terminals are a smaller size in the first region 110 as compared to those in the second region 112 and the symmetry second region 114.

Figure 7:
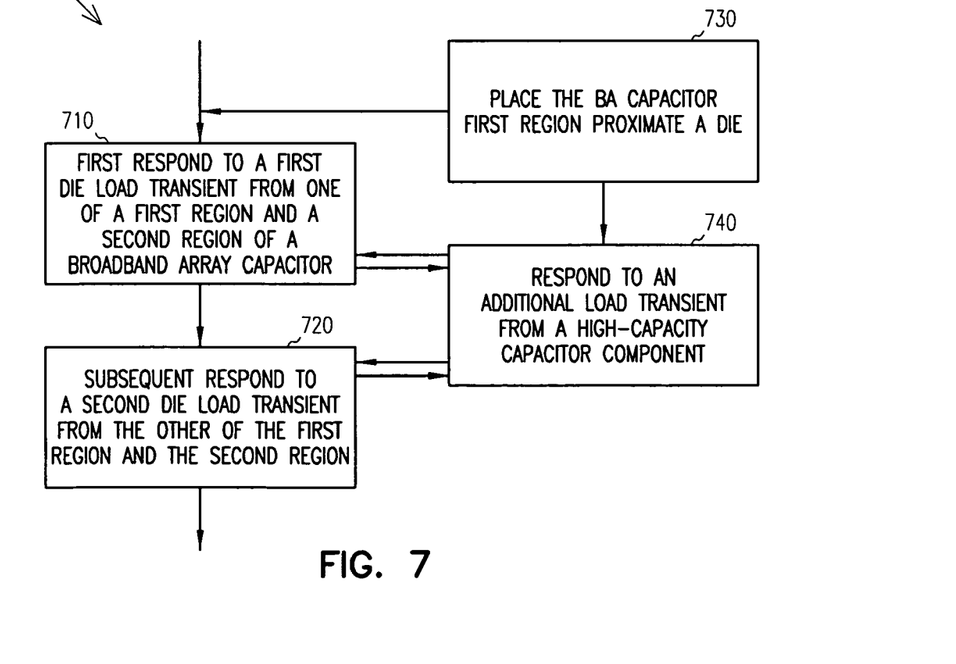
FIG. 7 is a process flow diagram according to various embodiments.

FIG. 7 is a process flow diagram 700 according to various embodiments.

At 710, the process flow includes first responding to a first die load transient from one of a first region and a second region of a BA capacitor assembly. By way of non-limiting example with the BA capacitor structure 406, the first region 410 responds to a load transient from the die 478. In an embodiment, the die 478 is a device such as a processor manufactured by Intel Corporation of Santa Clara, Calif. In an embodiment, the process is completed at 710.

At 720, the process continues by subsequent responding to a subsequent die load transient from one of the first region and the second region of the BA capacitor assembly. By way of non-limiting example, the BA capacitor structure 406, second region 412 responds to a subsequent load transient from the die 478. In an embodiment, the process returns to 710 and a die load transient is responded to by the first region. In an embodiment, the process return to 720 and a subsequent die load transient is responded to by the second region. In an embodiment, the process is completed at 720.

At 730, the process includes the design of placing the BA capacitor first region near a portion of the die that may subject the BA capacitor first region to a more frequent load transient duty. In an embodiment, the BA capacitor includes substantially an entire socket, and the BA capacitor first region is centered below the die. In an embodiment, the process begins at 730 flows to 710.

At 740, the process includes responding to a die load transient with a high-capacity capacitor component. By way of non-limiting example, the high-capacity capacitor component 486 is used to respond to a load transient demanded by the processor 478. In an embodiment, the process is preceded by the process at 730.

Figure 8:
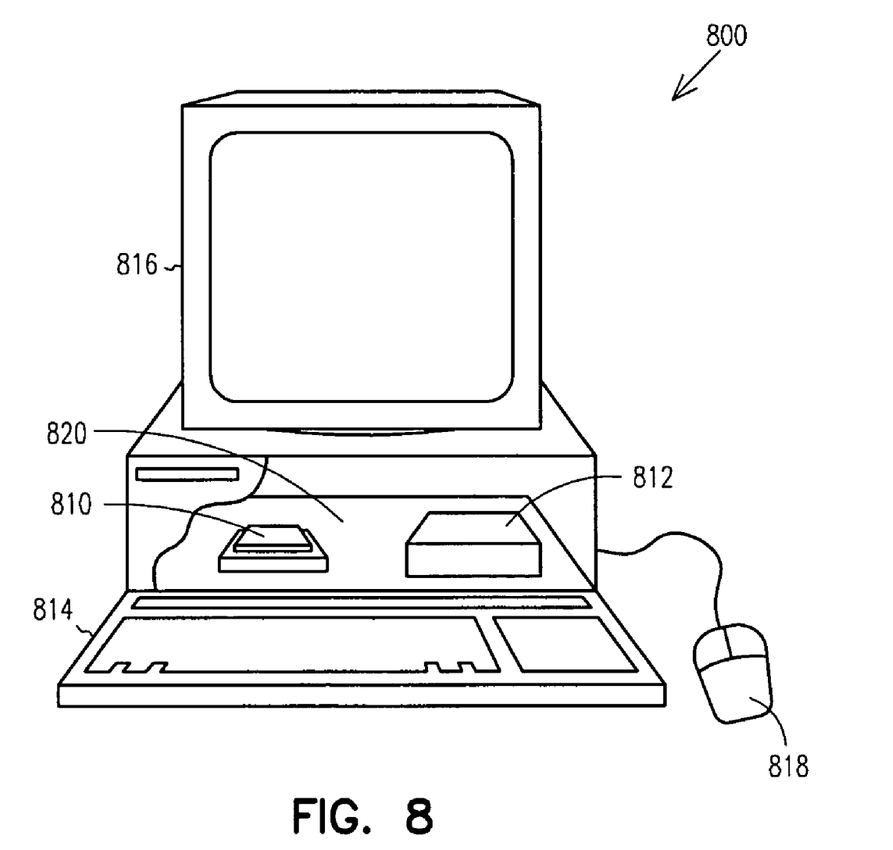
FIG. 8 is a depiction of a computing system according to an embodiment.

FIG. 8 is a depiction of a computing system 800 according to an embodiment. One or more of the foregoing embodiments of a broadband array capacitor assembly may be utilized in a computing system, such as a computing system 800 of FIG. 8. The computing system 800 includes at least one processor, which is enclosed in a package 810 and a data storage system 812 for example, for a data storage device such as dynamic random access memory, polymer memory, flash memory, and phase-change memory. The computing system 800 also includes at least one input device such as a keyboard 814, and at least one output device such as a monitor 816, for example. The computing system 800 includes a processor that processes data signals, and may include, for example, a microprocessor, available from Intel Corporation. In addition to the keyboard 814, the computing system 800 can include another user input device such as a mouse 818, for example.

For purposes of this disclosure, a computing system 800 embodying components in accordance with the claimed subject matter may include any system that utilizes a BA capacitor assembly, which may be coupled to a mounting substrate 820. In an embodiment, the BA capacitor assembly is in the package 810. In an embodiment, the BA capacitor assembly is in the package 810 and is coupled to a die, for example, as depicted in any of FIG. 4 or 5. The BA capacitor assembly can also be coupled to the mounting substrate 820 for a die that contains a digital signal processor (DSP), a micro-controller, an application specific integrated circuit (ASIC), or a microprocessor.

Embodiments set forth in this disclosure can be applied to devices and apparatuses other than a traditional computer. For example, a die can be packaged with an embodiment of the BA capacitor assembly and placed in a portable device such as a wireless communicator or a hand-held device such as a personal digital assistant and the like. Another example is a die that can be packaged with a BA capacitor assembly and placed in a vehicle such as an automobile, a locomotive, a watercraft, an aircraft, or a spacecraft.

The Abstract is provided to comply with 37 C.F.R. § 1.72 (b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A capacitor assembly comprising:
   a first region including a first capacitance;
   a second region laterally displaced from the first region including a second capacitance more than the first capacitance; and a plurality of parallel plates extending laterally between the first region and the second region, and wherein the first region and the second region share a plurality of parallel plates that extend laterally therebetween.

2. The capacitor assembly of claim 1, further including:
a third region including a third capacitance more than the second capacitance and less than the first capacitance; and
a plurality of parallel plates extending laterally between the second region and the third region and wherein the second region and the third region share a plurality of parallel plates that extend laterally therebetween.

3. The capacitor assembly of claim 1, further including:
a symmetry second region including substantially the second capacitance and disposed contiguous the first region and opposite the second region.

4. The capacitor assembly of claim 1, further including:
a third region including a third capacitance more than the second capacitance and less than the first capacitance;
a plurality of parallel plates extending laterally between the second region and the third region, and wherein the second region and the third region share a plurality of parallel plates that extend laterally therebetween;
a symmetry second region including substantially the second capacitance and disposed contiguous the first region and opposite the second region; and
a symmetry third region including substantially the third capacitance disposed contiguous the symmetry second region and opposite the third region.

5. The capacitor assembly of claim 1, wherein the capacitor includes a die side and a land side, wherein the die side includes a die-side first region terminal first pitch and a die-side second region terminal second pitch, and wherein the die-side first region terminal first pitch is denser than the die-side second region terminal second pitch.

6. The capacitor assembly of claim 1, wherein the capacitor includes a die side and a land side, wherein the land side includes a land-side region of substantially uniform terminal pitch.

7. The capacitor assembly of claim 1:
wherein the capacitor includes a die side and a land side, wherein the die side includes a die-side first region terminal first pitch and a die-side second region terminal second pitch, and wherein the die-side first region terminal first pitch is denser than the die-side second region terminal second pitch; and
wherein the land side includes a land-side region of substantially uniform terminal pitch.

8. A package comprising:
a socket; and
a broadband array capacitor coupled to the socket, including:
a first region including a first capacitance;
a second region laterally displaced from the first region including a second capacitance more than the first capacitance; and
a plurality of parallel plates extending laterally between the first region and the second region, and wherein the first region and the second region share a plurality of parallel plates that extend laterally therebetween.

9. The package of claim 8, wherein the broadband array capacitor is integral with the socket.

10. The package of claim 8, further including:
a die coupled to the broadband array capacitor, wherein the die is disposed on the socket at a die side.

11. The package of claim 8, further including:
a die coupled to the broadband array capacitor; and
a board coupled to the socket, wherein the broadband array capacitor is disposed between the board and the socket.

12. The package of claim 8, further including:
a die coupled to the broadband array capacitor; and
a board coupled to the socket, wherein the broadband array capacitor is disposed between the board and the socket, and wherein the broadband array capacitor is integral with the socket.

13. The package of claim 8, further including a high-capacity capacitor component coupled to the socket.

14. The package of claim 8, further including:
a die coupled to the broadband array capacitor;
a board coupled to the socket, wherein the broadband array capacitor is disposed between the board and the socket; and
a first high-capacity capacitor component and a second high-capacitor capacitor component coupled to the socket.

15. The package of claim 8, further including:
a third region including a third capacitance more than the second capacitance and less than the first capacitance; and
a plurality of parallel plates extending laterally between the second region and the third region, and wherein the third region and the second region share a plurality of parallel plates that extend laterally therebetween.

16. The package of claim 8, further including:
a symmetry second region including substantially the second capacitance and disposed contiguous the first region and opposite the second region.

17. The package of claim 8, further including:
a third region including a third capacitance more than the second capacitance and less than the first capacitance;
a plurality of parallel plates extending laterally between the second region and the third region, and wherein the third region and the second region share a plurality of parallel plates that extend laterally therebetween;
a symmetry second region including substantially the second capacitance and disposed contiguous the first region and opposite the second region; and
a symmetry third region including substantially the third capacitance disposed contiguous the symmetry second region and opposite the third region.

18. The package of claim 8, wherein the capacitor includes a die side and a land side, wherein the die side includes a die-side first region terminal first pitch and a die-side second region terminal second pitch, and wherein the die-side first region terminal first pitch is denser than the die-side second region terminal second pitch.

19. The package of claim 8, wherein the capacitor includes a die side and a land side, wherein the land side includes a land-side region of substantially uniform terminal pitch.

20. The package of claim 8:
wherein the capacitor includes a die side and a land side, wherein the die side includes a die-side first region terminal first pitch and a die-side second region terminal second pitch, and wherein the die-side first region terminal first pitch is denser than the die-side second region terminal second pitch; and
wherein the land side includes a land-side region of substantially uniform terminal pitch.

21. A capacitor assembly comprising:
a first region including a first capacitance;
a second region laterally displaced from the first region including a second capacitance more than the first capacitance;
a symmetry second region including substantially the second capacitance and disposed contiguous the first region and opposite the second region;
a plurality of parallel plates extending laterally between the first region and the second region, and wherein the first region and the second region share a plurality of parallel plates that extend laterally therebetween;
a third region including a third capacitance more than the second capacitance and less than the first capacitance; and
a plurality of parallel plates extending laterally between the second region and the third region, and wherein the third region and the second region share a plurality of parallel plates that extend laterally therebetween.

22. The capacitor assembly of claim 21, wherein the capacitor includes a die side and a land side, wherein the die side includes a die-side first region terminal first pitch and a die-side second region terminal second pitch, and wherein the die-side first region terminal first pitch is denser than the die-side second region terminal second pitch.

23. The capacitor assembly of claim 21, wherein the capacitor includes a die side and a land side, wherein the land side includes a land-side region of substantially uniform terminal pitch.

24. The capacitor assembly of claim 21:
wherein the capacitor includes a die side and a land side, wherein the die side includes a die-side first region terminal first pitch and a die-side second region terminal second pitch, and wherein the die-side first region terminal first pitch is denser than the die-side second region terminal second pitch; and
wherein the land side includes a land-side region of substantially uniform terminal pitch.

* * * * *